United States Patent [19]

Sheats

[11] Patent Number: 5,180,655
[45] Date of Patent: Jan. 19, 1993

[54] CHEMICAL COMPOSITIONS FOR IMPROVING PHOTOLITHOGRAPHIC PERFORMANCE

[75] Inventor: James R. Sheats, Palo Alto, Calif.

[73] Assignee: Hewlett-Packard Company, Palo Alto, Calif.

[21] Appl. No.: 534,296

[22] Filed: Jun. 6, 1990

Related U.S. Application Data

[63] Continuation of Ser. No. 264,297, Oct. 28, 1988, abandoned.

[51] Int. Cl.$^5$ ............................................... G03C 5/00
[52] U.S. Cl. ................................... 430/327; 430/272; 430/273; 430/394
[58] Field of Search ............... 430/272, 273, 394, 156, 430/328, 327, 311, 312, 339

[56] References Cited

U.S. PATENT DOCUMENTS 4,705,729  11/1987  Sheats ...................................... 430/5
4,792,516  12/1988  Toriumi et al. ...................... 430/196

FOREIGN PATENT DOCUMENTS 258295  7/1988  Fed. Rep. of Germany ...... 430/156

OTHER PUBLICATIONS

Bassous et al., IBM Tech. Dis. Bull. vol. 23 (7B), Dec. 1980, pp. 3387-3390.
Miller et al., "New Materials for Optical Microlithography", J. Imaging Sci., vol. 31(2), Mar./Apr. 1987, pp. 43-46.

Primary Examiner—Richard L. Schilling
Assistant Examiner—Thorl Chea

[57] ABSTRACT

Chemical compositions are presented that provide an increased rate of processing in a photolithography process in which a bleachable layer on top of a photoresist is bleached to produce a contact mask and then the photoresist is exposed through this contact mask. These compositions have increased oxygen permeability and increased solubility for a bleachable dye. Also, a class of dyes is presented that increase the process speed.

10 Claims, 7 Drawing Sheets

CHEMICAL COMPOSITIONS FOR IMPROVING PHOTOLITHOGRAPHIC PERFORMANCE

CROSS REFERENCE TO RELATED Application

This application is a continuation of application Ser. No. 07/264,297, filed Oct. 28, 1988, now abandoned.

FIELD OF THE INVENTION

This invention relates generally to multilayer photolithography integrated circuit processing and relates more particularly to chemical compositions that are particularly suitable for use in one class of such processes. In the figures and associated discussion, the first digit of a reference numeral indicates the number of the first figure in which that element is presented.

BACKGROUND OF THE INVENTION

In integrated circuit (IC) photolithography technology, significant effort has been expended on increasing the resolution of photoresist processes because greater resolution enables a greater number of circuits to be placed on a single chip. This increase in circuit density increases the potential complexity and speed of the resulting integrated circuit. In these photoresist processes, a photoresist is spun onto a wafer being processed and then selected regions of the photoresist are exposed by light that passes through a projection mask. The pattern of the projection mask determines which regions of the photoresist are exposed by this light. The photoresist is then developed to produce a contact mask on the wafer. The quality of the integrated circuit features is strongly affected by the quality of the photoresist contact masks used in the various IC processing steps. Therefore, it is very important that this contact mask accurately duplicate the pattern of the projection mask.

Present techniques in optical projection printing can resolve 1 micron lines in photoresist with good linewidth control when flat, low reflectivity substrates are used. However, when exposing photoresist on substrates with surface topography, there are photoresist control problems introduced by optical reflections and by photoresist thickness nonuniformity. Light reflected from the photoresist substrate interface produces optical interference with the incident light, producing undesired variation in the light intensity within the photoresist. This undesired variation of photoresist exposure degrades the IC features generated with this photoresist contact mask.

Linewidth control problems also arise from substrate topography. Because of the small depth of field of photolithography exposure systems, the photoresist film should be thin and planar. However, in the later steps of these photoresist processes, the photoresist is deposited on a surface that is nonplanar because of features produced in previous processing steps. Such nonplanarity will produce thickness variations of the photoresist layer and can also degrade the sharpness of imaging onto this layer because of the limited depth of field.

In U.S. Pat. No. 4,362,809 entitled "Multilayer Photoresist Process Utilizing an Absorbant Dye" issued to Chen et al on Dec. 7, 1982, these problems are overcome by a two layer process in which the bottom photoresist layer is thick enough to produce a planar top surface. This planarizing photoresist layer also contains a dye used to absorb incident light before it has a chance to interfere with the light in the thin top photoresist layer. The planarization by the bottom layer enables accurate exposure of the top photoresist layer. The dye in the bottom layer eliminates interference that would otherwise occur by light reflected by the substrate-bottom photoresist layer.

In U.S. Pat. No. 4,705,729 entitled "Method for photochemically enhancing resolution in photolithography processes" issued to James R. Sheats on Nov. 10, 1987, in place of this two layer photoresist process is a process utilizing a thick planarizing photoresist layer on top of which is formed a thin layer containing a bleachable dye. Light incident on this layer through a projection mask bleaches selected portions of this layer thereby creating a contact mask for use in exposing the bottom photoresist layer. While the top layer is photobleached, the underlying photoresist layer is made to be substantially unaffected by the photobleaching process. The further bleaching of the top layer is then prevented during exposure of the bottom layer through this contact mask.

In one embodiment of this process, the top layer is bleached at a high rate only if the light intensity is above a certain threshold level, called the reciprocity level. Below this level, the amount of reaction is a function of the light dosage (i.e., the intensity times the exposure time). Above the reciprocity threshold, the rate of bleaching is much faster and is a monotonically increasing function of intensity. Therefore, during the bleaching process, the intensity is high and the total dose of light is selected to bleach the top layer without significantly exposing the bottom photoresist layer. Then the bottom layer is exposed through this contact mask with uniform light of intensity lower than this threshold level, thereby substantially avoiding further bleaching of the bleachable layer.

In a second embodiment, the top layer bleaches only if oxygen is present in the ambient atmosphere. Therefore, during exposure of the photoresist layer through this contact mask, oxygen is excluded from the surface of this contact mask.

Unfortunately, the material utilized for the thin bleachable layer was far from optimal. In the first embodiment, the thin bleachable layer is poly(methylmethacrylate) (PMMA) containing approximately 20 wt. % acridine. This choice has two drawbacks. The intensity threshold at which bleaching occurs is sufficiently great that an excimer laser is needed to supply this intensity of light. Such exposure systems are more expensive than conventional systems and the high intensity of light can damage the optics, necessitating their more frequent replacement.

In the second embodiment, (presented in U.S. Pat. No. 4,705,729, which is assigned to the same assignee as the present application), anthracene derivatives are utilized in a polymer to form the bleachable layer. This embodiment utilizes low intensity light so that an excimer laser system is not required. However, most polymers (which must be present as a medium in which the dye is dissolved) are not very permeable to oxygen. Thus, very long exposure times are required in order to allow oxygen to diffuse into the film in sufficient quantities, otherwise a detrimental reciprocity failure occurs. For example, poly(ethylmethacrylate) and poly(styrene) are commonly available, good film-forming polymers into which anthracenes may be dissolved in large quantities (15–40 wt. %), but if they are used as the matrix to hold the bleachable dye, then exposure times on the order of 10 to 20 seconds are needed. This is too slow for a high-throughput manufacturing plant which requires an exposure time on the order of or less than 1.5 seconds and preferably less than 0.5 seconds.

SUMMARY OF THE INVENTION

In accordance with the preferred embodiment, materials are presented that enable the two layer process of copending U.S. patent application Ser. No. 080,945 abandoned to achieve exposure times that are short enough to be useful in a high-throughput manufacturing plant. Polymers are known that have much higher oxygen permeabilities than poly(ethylmethacrylate) and poly(styrene). For example, poly(dimethylsiloxane) has an oxygen permeability of 615 barrers, which is about 600 times greater than poly(ethylmethacrylate) and is more than adequate for use in the process of the above-discussed copending U.S. patent application Ser. No. 080,945 abandoned, that utilizes a bleachable layer on top of a photoresist layer to produce a contact mask on a substrate. However, anthracene derivatives, such as dimethylanthracene or diphenylanthracene are very poorly soluble in poly(dimethylsiloxane), and it is difficult to get a high enough molecular weight for the polymer to be a solid at room temperature.

Because of the decreased rate of bleaching (exhibited in FIGS. 5 and 6) above the reciprocity threshold, the parameters of the bleachable layer and the incident light intensity should be selected so that the incident light intensity is less than the reciprocity threshold $I_c$ during the bleaching step. Therefore, it is advantageous to have a high reciprocity threshold. This threshold has approximately the following dependence:

$$I_c = [u_0 * D * f(\mu)] / l^2 R \qquad (1)$$

where $f(\mu) = \mu^2 / [1 - e^{-\mu} - \mu e^{-\mu}]$, $R = [A_0 * T] / [(1 - T_0) T_0 * E]$, $A_0$ is the initial concentration of the anthracene derivative, T is the transmittance of the bleachable layer, E is the energy per unit area of the incident light, $T_0$ is the initial transmittance of the bleachable layer, D is the diffusivity of oxygen in the bleachable layer, l is the thickness of the bleachable layer, $u_0$ is the initial concentration of oxygen in the bleachable layer and $\mu$ is the initial base e optical density. The quantities T and E are to be measured near the beginning of the bleaching reaction. This equation can be derived from standard photobleaching theory (see, for example, J. J. Diamond and J. R. Sheats, IEEE Electron. Device Lett. EDL-7, 383-386 (1986).

Equation 1 indicates that the critical intensity can be raised either by decreasing l (thinner film) or by increasing the value of $P = u_0 * D$, the oxygen permeability of the bleachable layer. The film can be made thinner only if the concentration $A_0$ of the dye is increased enough to keep the opacity of the bleachable layer high enough to function as a contact mask for the photoresist layer. As shown in U.S. Pat. No. 4,705,729 and the above-cited paper by Diamond and Sheats, the lithographic performance of the bleachable layer as a contact mask is a function of the optical density, which is proportional to the product $A_0 * l$. Thus, a suitable choice for the polymer to serve as the matrix for the bleachable dye should have a high permeability for oxygen and should have significant solubility for the dye. It has been discovered that the high oxygen permeability can be achieved with polymers that contain a significant fraction of siloxy groups. The relatively high solubility of the dye in this polymer is achieved by requiring an adequate organic component in the polymer to provide a medium in which the organic dyes of interest will dissolve significantly.

DESCRIPTION OF THE PREFERRED EMBODIMENT

Figure 2:
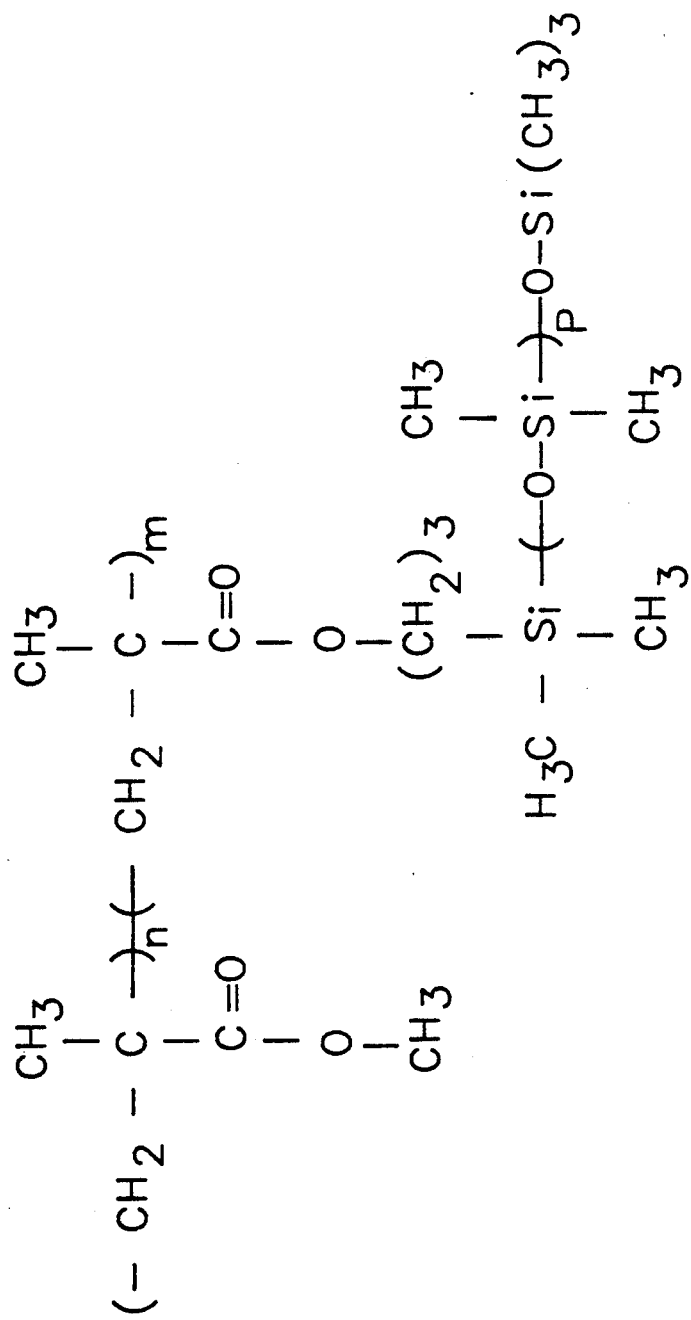
FIG. 2 illustrates the structure of a polymethylmethacrylate-g-poly(dimethylsiloxane)polymer to be used as a polymer matrix for a bleachable dye.
Figure 1:
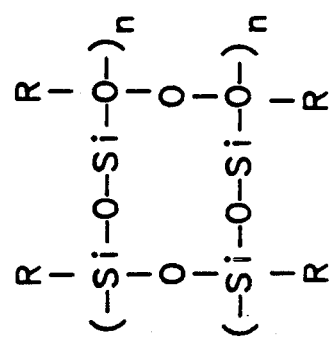
FIG. 1 illustrates the structure of a poly(R-silsequioxane) polymer to be used as a polymer matrix for a bleachable dye.
Figure 4:
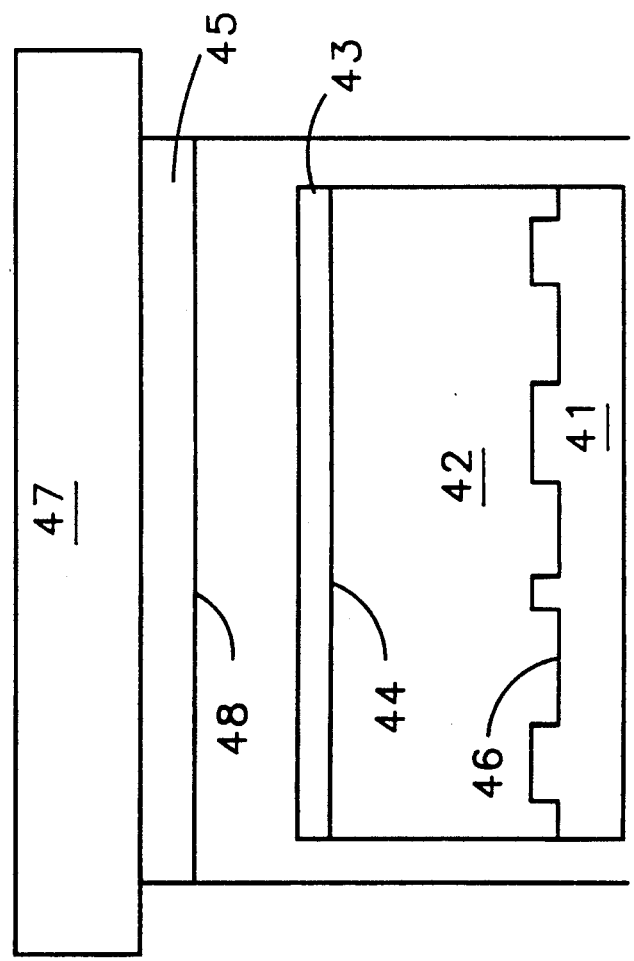
FIG. 4 illustrates the exposure of a wafer coated with a bleachable layer on top of a photoresist layer.

In FIGS. 1 and 2 are presented the structures of two classes of polymers that contain siloxy groups to provide oxygen permeability and that have sufficient organic molecule content to provide a matrix in which organic bleachable dyes have a sufficient solubility to be useful in the bleachable layer photoresist 2-layer contact mask process presented in U.S. Pat. No. 4,705,729 discussed above. In accordance with that process (illustrated in FIG. 4), on a substrate 41 is formed a photoresist layer 42 on top of which is formed a bleachable layer 43. Preferably, photoresist layer 42 is thick enough to produce a planar top surface 44 on which bleachable layer 43 is formed. This planarizing photoresist layer 42 should also contain a dye that absorbs light 45 used to bleach the bleachable layer so that this light is prevented from reflecting off of the substrate top surface 46 and interfering with the sharpness of the pattern bleached into the bleachable layer. This pattern is created by exposing the bleachable layer with light 45 that is projected from a light source through a projection mask 48. During bleaching of bleachable layer 43, the intensity of light 45 is below the reciprocity threshold of layer 43.

Figure 5:
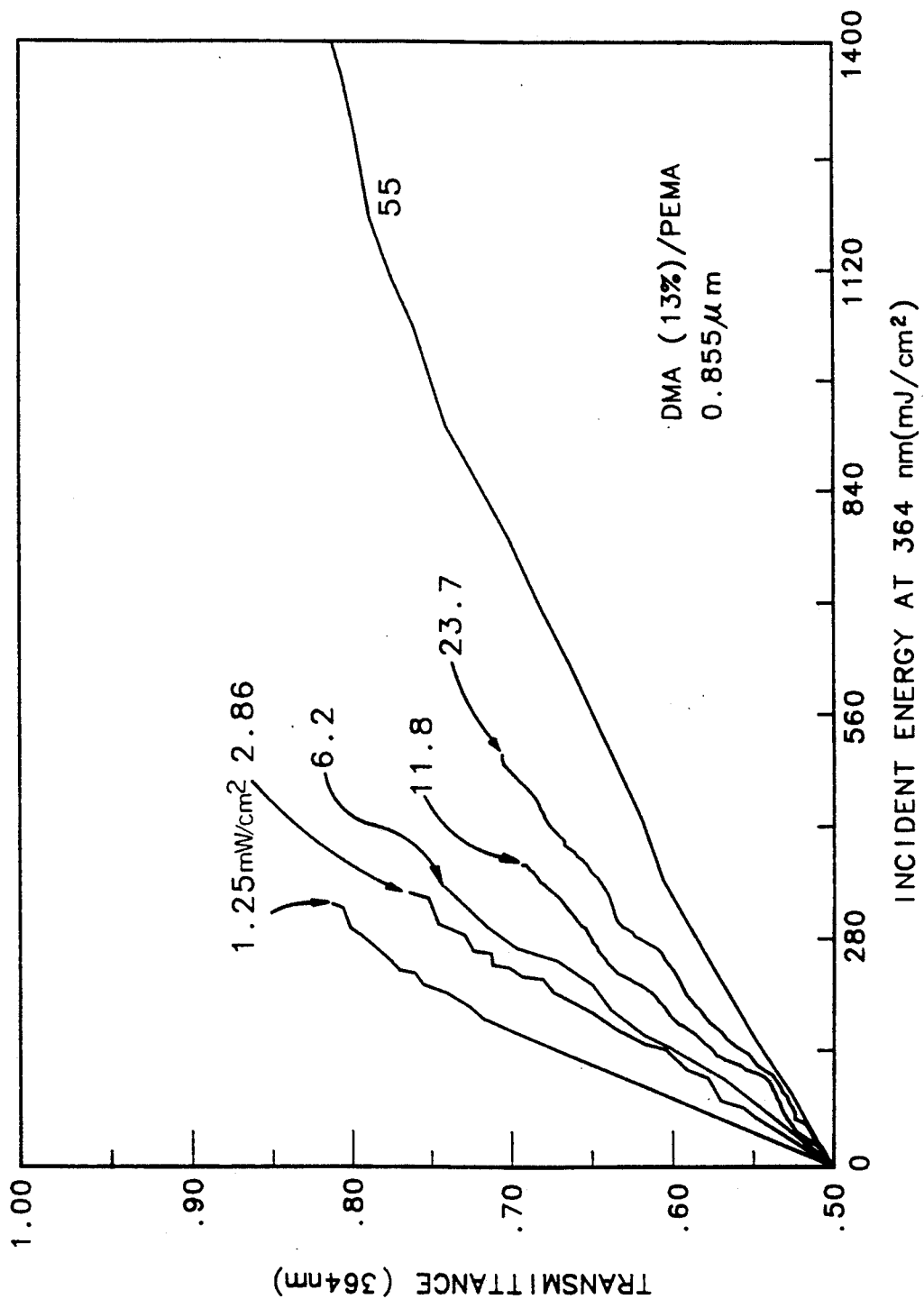
FIG. 5 is a reciprocity threshold curve for a bleachable layer consisting of 13 wt. % dimethylanthracene in a polymer matrix of polyethylmethacrylate, exposed by 0.364 micron light.
Figure 6:
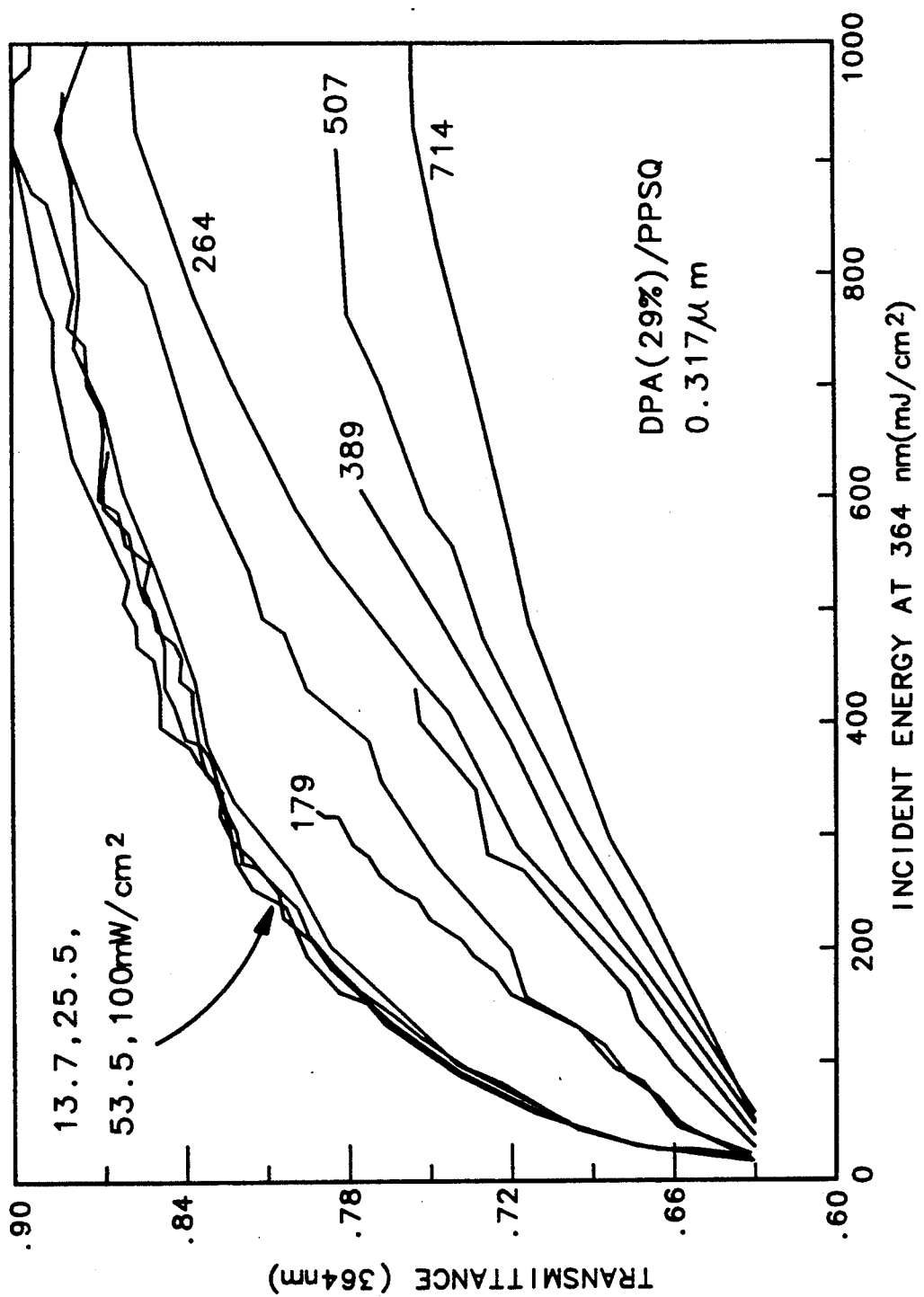
FIG. 6 is a reciprocity threshold curve for a bleachable layer consisting of 29 wt. % diphenylanthracene in a polymer matrix of poly(phenylsilsesquioxane) exposed by 0.364 micron light.

Bleachable layer 43 typically consists of a polymer matrix in which is contained a bleachable dye. Use of a polymer is advantageous because it enables layer 43 to be spun onto the top of photoresist layer 42. The first class of compounds, illustrated in FIG. 1, consists of poly(R-silsesquioxane)s. As illustrated in this figure, these compounds form a polymer matrix having a siloxy backbone. The organic R groups attached to the side of this siloxy backbone need not be identical, but should be alkyl groups (for example, methyl, ethyl, etcetera) and/or aryl groups (for example, phenyl, etcetera). These organic side groups provide the organic matrix interface that enhances the solubility of this polymer matrix have a for organic bleachable dyes. The siloxy backbone results in a high oxygen permeability of this polymer. These polymers have oxygen permeabilities about 5-10 times greater than poly(ethylmethacrylate). Poly(phenylsilsesquioxane) can incorporate up to about 25 wt. % diphenylanthracene in a spin-cast layer and the oxygen permeability is about 10 times better than a similar layer with poly(ethylmethacrylate). The reciprocity failure curves for these two compounds are shown in FIGS. 5 and 6.

Using a bleachable layer with base 10 optical density of about 2.7, (the minimum required for the lithographic application), 0.5 micron features can be printed with good fidelity by a projection camera with a 0.42 numerical aperture lens and 436 nm light. The exposure time, using 260 nm light for the pattern transfer, is about 1.5 seconds and therefore is adequate for manufacturing purposes. Other bleachable layers using both methylsilsesquioxanes and phenylsilsesquioxanes have similar properties.

The second class of compounds, illustrated in FIG. 2, consists of poly(methylmethacrylate)-g-poly(dimethylsiloxane)s. That is, some fraction m/(m+n) of the polymer consists of methylmethacrylate groups and the remaining fraction n/(m+n) of the polymer consists of methylmethacrylate groups to which a dimethylsiloxane group has been grafted.

There is a considerable variety of structures that can be produced by the grafting method, including variations in the amount of siloxane incorporated as well as the molecular weight $M_n$ of the polymer. In addition, poly(ethylmethacrylate) or other methacrylates can be used for the backbone. These variations can confer advantages in ease of processing as well as oxygen permeability characteristics. Such synthesis is known in the literature (see, for example, J. E. McGrath, Polymeric Mat. Sci. Eng. vol. 56, 852 (1987). These polymers exhibit oxygen permeabilities in the range of 10-40 times that of polyethylmethacrylate. Table I lists 5 examples of this class of compound in which 30 wt. % diphenylanthracene is soluble.

TABLE 1

| Wt. % of Siloxane in polymer: | | | | |
|---|---|---|---|---|
| 20 | 20 | 20 | 20 | 5 |
| $M_n$: $1 \times 10^3$ | $5 \times 10^3$ | $10^4$ | $2 \times 10^4$ | $2 \times 10^4$ |

Thus, the reciprocity threshold will be larger than for poly(phenylsilsesquioxane) by the factor by which oxygen permeability $P(O_2)$ exceeds $P(O_2)$ for poly(phenylsilsesquioxane)— namely, by about a factor of 1-4. This therefore lower the 1.5 second exposure time to about 0.5 seconds as is preferred for a manufacturing process.

Figure 7:
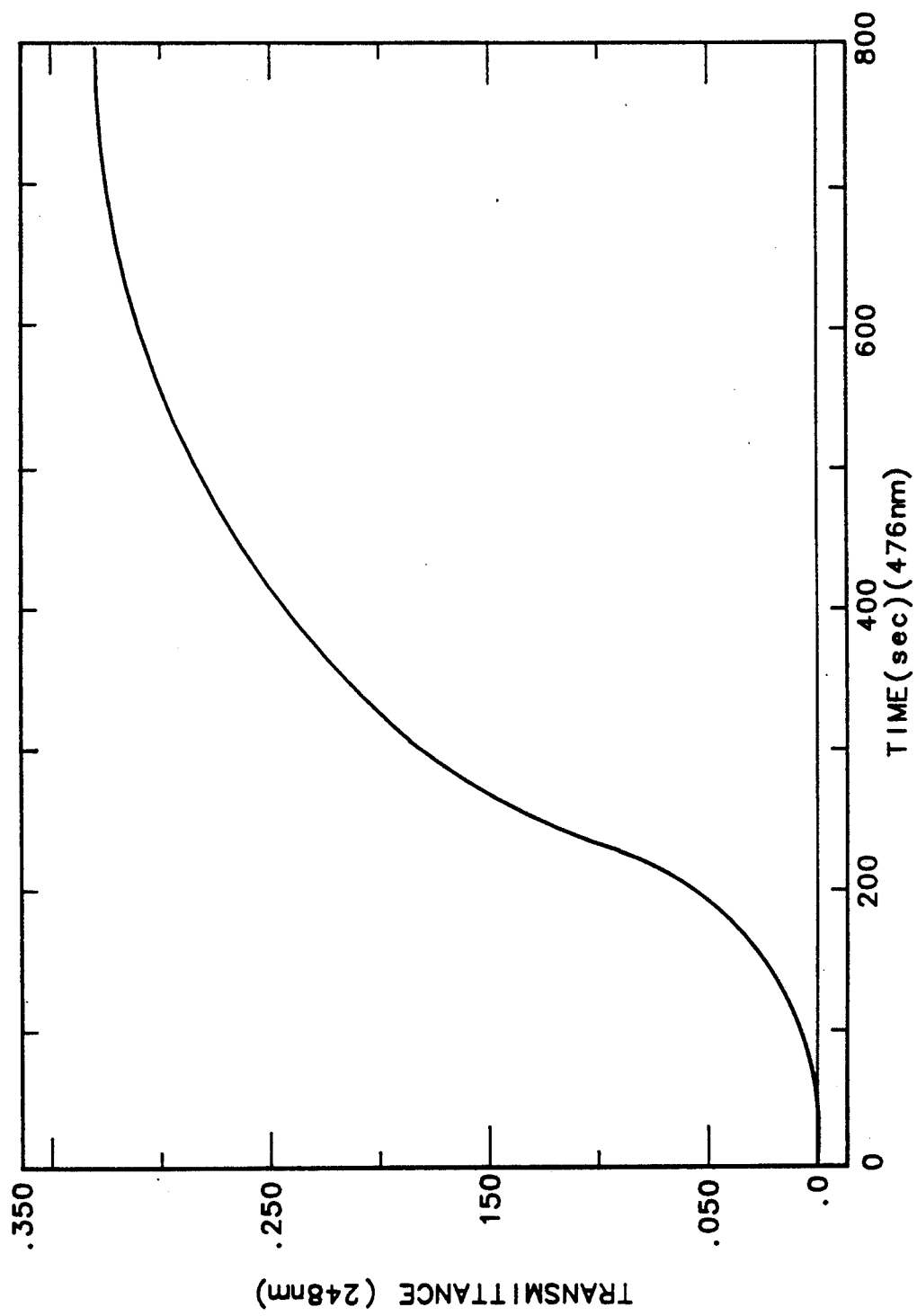
FIG. 7 shows, for the case of 30 wt. % 1,2 bis(10-trimethylsiloxy-9-anthryl)ethane dye in a poly(phenylsilsesquioxane) polymer matrix bleachable layer, the variation of transmittance of this layer with time during the step of bleaching.

As equation 1 indicates, a second way to raise the reciprocity threshold $I_c$ is by increasing the concentration of dye in the bleachable layer. This enables the film thickness to be reduced while keeping the optical density constant. This requires that the dye be more soluble in the polymer than is the case for diphenylanthracene. It has been found that 10,10'-substituted 1,2-di(9-anthryl)ethanes do have greatly improved solubility. For example, 1,2-bis(10-trimethylsiloxy)-9-anthryl)ethane (shown in FIG. 3) was cast into a film as a 30 wt. % solution in poly(phenylsilsequioxane), with no sign of crystallization, whereas 25 wt. % diphenylanthracene in poly(phenylsilsequioxane) forms crystals unless stringent precautions are taken to avoid nucleating sites. The maximum fraction of 1,2-bis(10-trimethylsiloxy)-9-anthryl)ethane that can be incorporated in a homogeneous film of poly(phenylsilsequioxane) is at least 40 wt. %. Thus, since the reciprocity threshold $I_c$ depends quadratically on the thickness 1 of the bleachable layer, and 1 (at constant optical density) depends inversely on dye concentration, there is an improvement in exposure time over diphenylanthracene thus reducing the exposure time of 1.5 seconds obtained with diphenylanthracene to meet the needs of a manufacturing process. The bleaching characteristics of 1,2-bis(10-trimethylsiloxy-9-anthryl)ethane are shown in FIG. 7. This shows that it has similar lithographic performance with diphenylanthracene. Such dyes can be combined with the graft copolymers described above to give even better oxygen permeability. In addition, the dye can alternatively be bonded into the groups that form the polymer.

Figure 3:
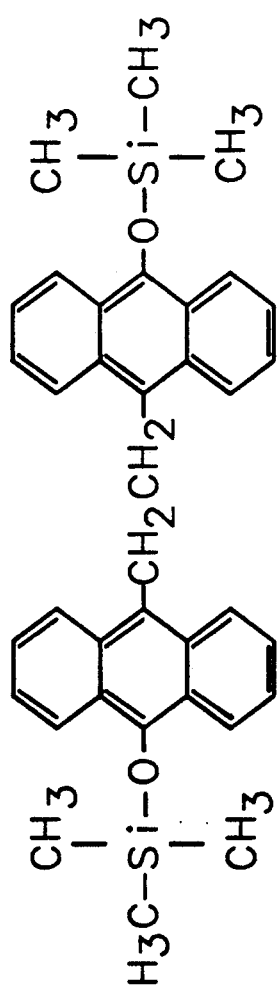
FIG. 3 illustrates the structure of a 1,2 bis(10-trimethylsiloxy)-9-anthryl)ethane dye that is particularly soluble in the polymer matrices formed of the compounds of FIGS. 1 and 2.

The 1,2-bis(10-trimethylsiloxy)-9-anthryl)ethane compound of FIG. 3 has been prepared by procedures well known in the literature (see, for example, H. D. Becker, D. Sanchez, and A. Arvidsson, J. Org. Chem. vol. 44, 4247-4251 (1979). Various other substituents can be used instead of the trimethylsiloxy group. For example, alkoxys (such as methoxy, ethoxy, etc.), acetoxy, phenyl, cyclohexyl, butyl, and others can be substituted for the trimethylsiloxy group. Such groups help prevent unwanted dimerization and can provide desirable shifts in the spectral properties and improvements in the quantum yield of bleaching as well as solubility characteristics. The dimerization is undesirable because the dimers can dissociate under the deep UV exposure of the photoresist layer through the contact mask formed in bleachable layer 43. Such antibleaching will degrade the quality of this contact mask.

Figure 8:
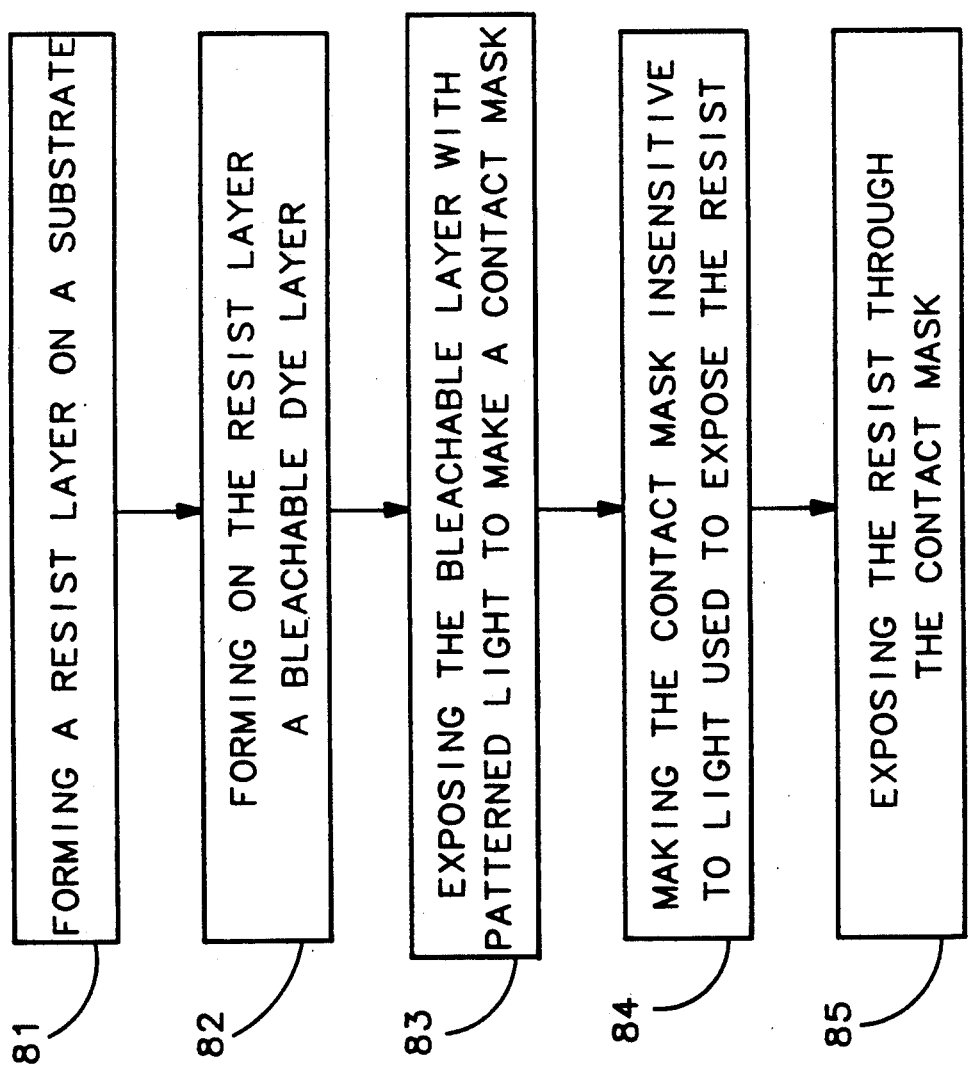
FIG. 8 illustrates the photolithography steps utilizing the photoresist and bleachable layer to produce a contact mask on a substrate.

FIG. 8 illustrates the steps of producing a contact mask on a substrate 41. In step 81, a photoresist layer 42 is formed on top of a substrate 41, such as by spinning the photoresist onto the substrate. In step 82, a bleachable layer (44) is formed on top of this photoresist layer, for example by spinning a bleachable material onto the photoresist. In step 83, the bleachable layer is exposed by patterned light to replicate this pattern in this layer, thereby forming a contact mask. In step 84, the mask is made insensitive to light used to expose the substrate through this contact mask. This can be done by reducing the light intensity below the reciprocal threshold of the bleachable layer or, in some embodiments, by exluding oxygen from the bleachable layer. This latter method can be embodied by blowing nitrogen across the bleachable layer or by enclosing the substrate within a container in which oxygen can be selectively excluded. In step 85, the photoresist layer is exposed through this contact mask to transfer the pattern of this mask into the photoresist layer.

Figure 9A:
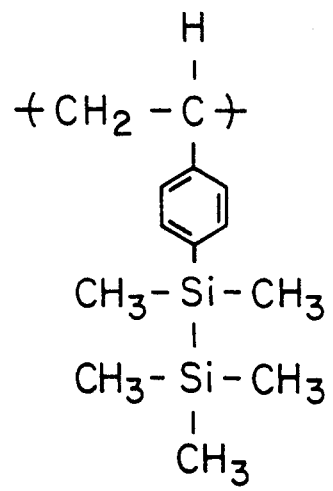
FIGS. 9A and 9B illustrate two more classes of compound that are suitable for producing the polymer matrix in which the bleachable dye can be dispersed.
Figure 9B:
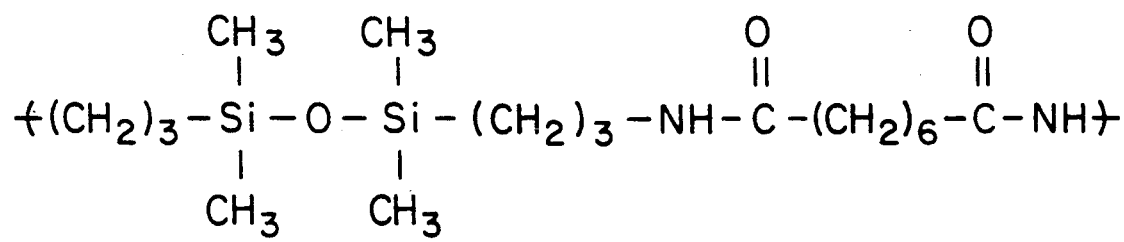

FIGS. 9A and 9B illustrate two more classes of compounds that are suitable for producing the polymer matrix in which the bleachable dye can be dispersed. One of these classes (FIG. 9A) consists of polymers having polystyrene units with appended siloxane chains. The other of these classes (FIG. 9B) consists of polymers having polyamide units connected to siloxane chains.

What is claimed is:

1. A photolithographic method comprising the steps of:
   (a) forming a photoresist layer on a substrate;
   (b) forming, on top of said photoresist layer, a bleachable layer containing a bleachable dye in a polymer matrix containing siloxy groups and organic groups;
   (c) exposing said bleachable layer with preselected pattern of light to convert said bleachable layer into a contact mask;
   (d) making said contact mask insensitive to light used to expose the photoresist layer through this contact mask; and
   (e) exposing with light said photoresist layer through said contact mask to transfer the pattern of the contact mask into the photoresist layer.

2. A method as in claim 1, wherein step (b) comprises forming on tip of said photoresist layer said bleachable layer containing a bleachable organic dye in a polymer matrix containing (R-silsesquioxane) groups, where each R group is selected from the class consisting of alkyls and aryls and where the R groups on the various silsesquioxanes in this polymer need not be the same.

3. A method as in claim 1 wherein step (b) comprises reducing the intensity of light used to expose the bleachable dye layer below a reciprocity threshold of said bleachable layer.

4. A method as in claim 1 wherein step (d) comprises preventing oxygen from being in contact with the bleachable layer during exposure of the photoresist layer through said contact mask.

5. A method as in claim 1, wherein step (b) comprises forming on top of said photoresist layer said bleachable layer containing a bleachable organic dye in a polymer matrix containing (methylmethacrylate) and (methylmethacrylate)-g-(dimethylsiloxane) groups.

6. A method as in claim 2 wherein step (d) comprises reducing the intensity of light used to expose the bleachable dye layer below a reciprocity threshold of said bleachable layer.

7. A method as in claim 2 wherein step (d) comprises preventing oxygen from being in contact with the bleachable layer during exposure of the photoresist layer through said contact mask.

8. A method as in claim 1 wherein step (b) comprises the step of forming, on top of said photoresist layer, said bleachable layer containing diphenylanthracene.

9. A method as in claim 1 wherein step (b) comprises forming on top of said photoresist layer said bleachable layer containing a bleachable organic dye in a polymer matrix containing polystyrene units with appended siloxane chains.

10. A method as in claim 1, wherein step (b) comprises forming on top of said photoresist layer said bleachable layer containing a bleachable organic dye in a polymer matrix containing polyamide units connected to siloxane chains.

* * * * *